United States Patent
Yan et al.

(10) Patent No.: US 10,453,900 B2
(45) Date of Patent: Oct. 22, 2019

(54) DISPLAY PANEL, DRIVING METHOD THEREOF, AND DISPLAY DEVICE

(71) Applicant: BOE Technology Group Co., Ltd., Beijing (CN)

(72) Inventors: Guang Yan, Beijing (CN); Dongfang Yang, Beijing (CN); Chinlung Liao, Beijing (CN); Changyen Wu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 15 days.

(21) Appl. No.: 15/839,986

(22) Filed: Dec. 13, 2017

(65) Prior Publication Data

US 2018/0323241 A1    Nov. 8, 2018

(30) Foreign Application Priority Data

May 3, 2017 (CN) .......................... 2017 1 0305784

(51) Int. Cl.
| | | |
|---|---|---|
| *H01L 27/32* | (2006.01) | |
| *H01L 51/52* | (2006.01) | |
| *G09G 3/3258* | (2016.01) | |

(52) U.S. Cl.
CPC ....... *H01L 27/3209* (2013.01); *G09G 3/3258* (2013.01); *H01L 27/3202* (2013.01); *H01L 27/3211* (2013.01); *H01L 51/5206* (2013.01); *H01L 51/5234* (2013.01); *G09G 2300/0426* (2013.01); *G09G 2300/0443* (2013.01);
(Continued)

(58) Field of Classification Search
None
See application file for complete search history.

(56) References Cited

U.S. PATENT DOCUMENTS

| | | | |
|---|---|---|---|
| 6,800,999 B1 | 10/2004 | Duggal et al. | |
| 2005/0133783 A1* | 6/2005 | Yamazaki | ........... H01L 27/3244 257/40 |

(Continued)

FOREIGN PATENT DOCUMENTS

| | | |
|---|---|---|
| CN | 1303228 A | 7/2001 |
| CN | 1423514 A | 6/2003 |

(Continued)

OTHER PUBLICATIONS

The First Office Action dated Nov. 5, 2018 for CN Application No. 201710305784.2.

(Continued)

*Primary Examiner* — Kenneth B Lee, Jr.
(74) *Attorney, Agent, or Firm* — Fay Sharpe LLP

(57) ABSTRACT

A display panel, a driving method thereof, and a display device are provided in the field of display technology. The display panel includes: a plurality of sub-pixels arranged in an array. The plurality of sub-pixels arranged in an array include at least one target sub-pixel, and each target sub-pixel includes: a first electrode, a second electrode and N light-emitting units arranged in a laminated mode between the first electrode and the second electrode, wherein N is an integer greater than 1. A transparent electrode is arranged between any two adjacent light-emitting units among the N light-emitting units, and each light-emitting unit is configured to emit light under the drive of two electrodes adjacent thereto.

17 Claims, 4 Drawing Sheets

(52) U.S. Cl.
CPC ............ *G09G 2300/0452* (2013.01); *G09G 2320/043* (2013.01); *G09G 2320/0626* (2013.01); *H01L 2251/558* (2013.01); *H01L 2251/564* (2013.01)

(56) References Cited

U.S. PATENT DOCUMENTS

| | | |
|---|---|---|
| 2006/0125410 A1 | 6/2006 | Duggal et al. |
| 2006/0232992 A1 | 10/2006 | Bertram et al. |
| 2009/0009101 A1* | 1/2009 | Kang ................ H01L 27/3209 315/250 |
| 2013/0153879 A1 | 6/2013 | Kim et al. |

FOREIGN PATENT DOCUMENTS

| | | |
|---|---|---|
| CN | 1836332 A | 9/2006 |
| CN | 101371619 A | 2/2009 |
| CN | 103168374 A | 6/2013 |

OTHER PUBLICATIONS

The Second Office Action dated Dec. 18, 2018 for CN Application No. 201710305784.2.

\* cited by examiner

101 — a first driving stage: a driving signal in a first direction is provided via the AC driver such that the voltage of the first electrode is a positive voltage relative to the voltage of the transparent electrode, so as to drive the first light-emitting unit to emit light 102 — a driving signal in a second direction is provided via the AC driver such that the voltage of the transparent electrode is a positive voltage relative to the voltage of the second electrode, so as to drive the second light-emitting unit to emit light

FIG. 8

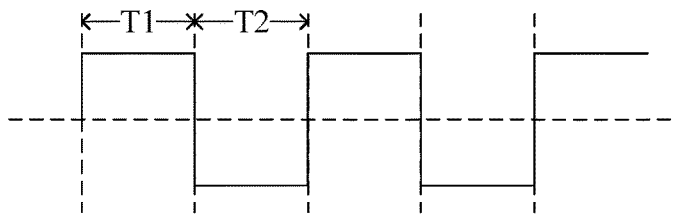

FIG. 9

DISPLAY PANEL, DRIVING METHOD THEREOF, AND DISPLAY DEVICE

CROSS-REFERENCE TO RELATED APPLICATION

This application claims priority to Chinese Patent Application No.: 201710305784.2, filed with the State Intellectual Property Office on May 3, 2017 and titled "DISPLAY PANEL, DRIVING METHOD THEREOF, AND DISPLAY DEVICE", which is incorporated herein by reference in its entirety.

TECHNICAL FIELD

The present disclosure relates to the field of display technology, and particularly to a display panel, a driving method thereof and a display device.

BACKGROUND

With the development of display technology, Organic Light Emitting Diodes (OLED) have been increasingly applied in high performance display devices for their features of self-luminescence, fast response, wide viewing angle and etc.

In the related art, an OLED display panel generally includes an anode, a light-emitting unit and a cathode formed on a basal substrate. Specifically, the light-emitting unit may include an electron transport layer, a light-emitting layer and a hole transport layer. When voltages are applied to the anode and the cathode, electrons may be transferred from the cathode to the light-emitting layer through the electron transport layer, and holes may be transferred from the anode to the light-emitting layer through the hole transport layer. The electrons and holes meet in the light-emitting layer and recombine to form excitons. Excitons can transfer energy to the light-emitting molecules in the light-emitting layer under the action of an electric field, to enable the light-emitting molecules to emit visible light.

SUMMARY

The present disclosure provides a display panel, a driving method thereof and a display device. The technical solutions are as follows:

In a first aspect, there is provided a display panel. The display panel includes: a plurality of sub-pixels arranged in an array. The plurality of sub-pixels arranged in an array include at least one target sub-pixel, and each target sub-pixel includes: a first electrode, a second electrode and N light-emitting units arranged in a laminated mode between the first electrode and the second electrode, wherein N is an integer greater than 1; a transparent electrode is arranged between any two adjacent light-emitting units among the N light-emitting units, and each light-emitting unit is configured to emit light under the drive of two electrodes adjacent thereto.

In some embodiments, the each target sub-pixel includes two light-emitting units arranged in a laminated mode; and the first light-emitting unit of the two light-emitting units is configured to emit light under the drive of the transparent electrode and the first electrode, and the second light-emitting unit of the two light-emitting units is configured to emit light under the drive of the transparent electrode and the second electrode.

In some embodiments, the transparent electrode arranged between the two light-emitting units is connected to an electrode of an AC driver, and the first electrode and the second electrode are respectively connected to an other electrode of the AC driver.

In some embodiments, the each light-emitting unit includes a hole transport layer, a light-emitting layer and an electron transport layer sequentially arranged in a laminated mode; and the electron transport layer in the first light-emitting unit and the hole transport layer in the second light-emitting unit are respectively at two sides of the transparent electrode.

In some embodiments, the each light-emitting unit includes: a plurality of light-emitting sub-units arranged in series, and each of the light-emitting sub-unit includes a hole transport layer, a light-emitting layer and an electron transport layer sequentially arranged in a laminated mode; and the electron transport layer in the first light-emitting unit and the hole transport layer in the second light-emitting unit are respectively at two sides of the transparent electrode.

In some embodiments, the each sub-pixel in the display panel, except the target sub-pixel, includes: a first electrode, a second electrode and a light-emitting unit arranged between the first electrode and the second electrode.

In some embodiments, the first electrode and the second electrode in the each sub sub-pixel, except the target sub-pixel, are respectively connected to two electrodes of a DC driver.

In some embodiments, the each sub-pixel in the display panel is the target sub-pixel.

In some embodiments, light rays emitted from the N light-emitting units in the each target sub-pixel are of the same color.

In some embodiments, the plurality of sub-pixels arranged in an array include sub-pixels of various colors, and the at least one target sub-pixel is a sub-pixel of a first color.

In some embodiments, the plurality of sub-pixels arranged in an array include red sub-pixels, green sub-pixels and blue sub-pixels, and the at least one target sub-pixel is the blue sub-pixel.

In some embodiments, the transparent electrode is manufactured from a metal material and/or a metal oxide material.

In some embodiments, the metal material includes at least one of the materials selected from the group of: lithium, magnesium, silver, gold, aluminum, aluminum lithium alloy, calcium, magnesium indium alloy and magnesium silver alloy; and the metal oxide material includes at least one of the materials selected from the group of: indium tin oxide, indium zinc oxide, zinc oxide, aluminum-doped zinc oxide, indium oxide and tin oxide.

In some embodiments, the thickness range of the transparent electrode is 10 nm-20 nm.

In a second aspect, there is provided a method for driving a display panel. The display panel includes: a plurality of sub-pixels arranged in an array. The plurality of sub-pixels arranged in an array include at least one target sub-pixel, and each target sub-pixel includes: a first electrode, a second electrode and N light-emitting units arranged in a laminated mode between the first electrode and the second electrode, wherein N is an integer greater than 1; a transparent electrode is arranged between any two adjacent light-emitting units among the N light-emitting units, and each light-emitting unit is configured to emit light under the drive of two electrodes adjacent thereto; the method includes: N driving stages, wherein N is an integer greater than 1; during an $i^{th}$ driving stage of the N driving stages, applying voltages to electrodes at two sides of an $i^{th}$ light-emitting unit in each target sub-pixel to drive the $i^{th}$ light-emitting unit to emit light, wherein i is a positive integer less than or equal to N.

In some embodiments, the each target sub-pixel includes two light-emitting units arranged in a laminated mode. The transparent electrode arranged between the two light-emitting units is connected to an electrode of an AC driver, the first electrode and the second electrode are respectively connected to an other electrode of the AC driver, and N is equal to 2; during a first driving stage of the N driving stages, applying voltages to electrodes at two sides of a first light-emitting unit in the each target sub-pixel to drive the first light-emitting unit to emit light includes: providing a driving signal in a first direction via the AC driver such that the voltage of the first electrode is a positive voltage relative to the voltage of the transparent electrode, so as to drive the first light-emitting unit to emit light; and during a second driving stage of the N driving stages, applying voltages to electrodes at two sides of a second light-emitting unit in the each target sub-pixel to drive the second light-emitting unit to emit light includes: providing a driving signal in a second direction via the AC driver such that the voltage of the transparent electrode is a positive voltage relative to the voltage of the second electrode, so as to drive the second light-emitting unit to emit light.

In a third aspect, there is provided a display device. The display device includes a display panel.

The display panel includes: a plurality of sub-pixels arranged in an array. The plurality of sub-pixels arranged in an array include at least one target sub-pixel, and each target sub-pixel includes: a first electrode, a second electrode and N light-emitting units arranged in a laminated mode between the first electrode and the second electrode, wherein N is an integer greater than 1; and a transparent electrode is arranged between any two adjacent light-emitting units among the N light-emitting units, and each light-emitting unit is configured to emit light under the drive of two electrodes adjacent thereto.

In some embodiments, the each target sub-pixel in the display panel includes two light-emitting units arranged in a laminated mode, and the display device further includes: an AC driver.

An electrode of the AC driver is connected to the transparent electrode of the each target sub-pixel in the display panel and the other electrode thereof is connected to the first electrode and the second electrode in the each target sub-pixel respectively.

In some embodiments, the each sub-pixel in the display panel, except the target sub-pixel, includes: a first electrode, a second electrode and a light-emitting unit arranged between the first electrode and the second electrode. The display device further includes: a DC driver.

Two electrodes of the DC driver are respectively connected to the first electrode and the second electrode in each sub-pixel, except the target sub-pixel.

In some embodiments, light rays emitted from the N light-emitting units in the each target sub-pixel are of the same color.

BRIEF DESCRIPTION OF THE DRAWINGS

To describe the technical solutions in the embodiments of the present more clearly, the following briefly introduces the accompanying drawings that illustrate aspects of the various embodiments. Apparently, the accompanying drawings in the following description show merely some embodiments of the present disclosure, and a person of ordinary skill in the art may readily derive other drawings from these accompanying drawings without creative efforts.

FIG. 8 is a flow chart of a method for driving a display panel provided in an embodiment of the present disclosure;

FIG. 9 is a sequence diagram of a driving signal outputted by an AC driver provided in an embodiment of the present disclosure.

DETAILED DESCRIPTION

Embodiments of the present disclosure will be described in further detail with reference to the enclosed drawings, to clearly present the objects, technique solutions, and advantages of the present disclosure.

As the service time of the OLED display device increases, the electrons and holes which do not recombine and accumulate in the light-emitting layer cause an built-in electric field to be formed inside the OLED, resulting in a continuous rise in the threshold voltage of the OLED. Thus, the luminance and energy utilization efficiency of the OLED gradually decrease, thereby affecting the service life of the OLED display device.

Figure 1:
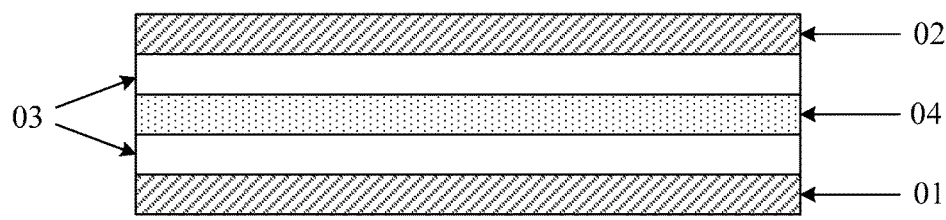
FIG. 1 is a structural schematic diagram of a target sub-pixel in a display panel provided in an embodiment of the present disclosure.

The embodiments of the present disclosure provide a display panel. The display panel may be an OLED display panel and may include: a plurality of sub-pixels arranged in an array. The plurality of sub-pixels arranged in an array include at least target sub-pixel. FIG. 1 illustrates a structural schematic diagram of a target sub-pixel provided in the embodiment of the present disclosure. Referring to FIG. 1, each target sub-pixel may include: a first electrode 01, a second electrode 02 and N light-emitting units 03 arranged in a laminated mode between the first electrode 01 and the second electrode 02. N is an integer greater than 1. For example, the target sub-pixel shown in FIG. 1 is provided with two light-emitting units 03.

A transparent electrode is arranged between any two adjacent light-emitting units among the N light-emitting units 03. Each light-emitting unit is configured to emit light under the drive of two electrodes adjacent thereto.

For example, in the target sub-pixel shown in FIG. 1, one light-emitting unit of the two light-emitting units 03 is configured to emit light under the drive of the first electrode 01 and a transparent electrode 04, and the other light-emitting unit is configured to emit light under the drive of the transparent electrode 04 and the second electrode 02.

In summary, there is provided a display panel in the embodiments of the present disclosure. There is at least one target sub-pixel in the display panel. A plurality of light-emitting units are arranged in a laminated mode between two electrodes of each target sub-pixel, and a transparent electrode is arranged between any two adjacent light-emitting units. Thus, each light-emitting unit may be driven respectively through the electrodes at two sides of each light-emitting unit and the plurality of light-emitting units may be controlled to work alternately, to reduce the working hours of each light-emitting unit so as to lengthen the service life of the display panel.

In the embodiments of the present disclosure, the thickness range of the transparent electrode may be 10 nm to 20 nm. That is, the thickness of the transparent electrode may be greater than or equal to 10 nm and be less than or equal to 20 nm. The thickness direction of the transparent electrode may be perpendicular to the light emergent surface of the display panel. The transparent electrode may be manufactured from a metal material and/or a metal oxide material. The metal material may include at least one of the materials selected from the group of: lithium, magnesium, silver, gold, aluminum, aluminum lithium alloy, calcium, magnesium indium alloy and magnesium silver alloy. The metal oxide material may include at least one of the materials selected from the group of: indium tin oxide, indium zinc oxide, zinc oxide, aluminum-doped zinc oxide, indium oxide and tin oxide.

In the embodiments of the present disclosure, light rays emitted from the N light-emitting units in the each target sub-pixel are of the same color. That is, the light-emitting layers in various light-emitting units may be formed of the same light-emitting material. During the light-emitting process of the display panel, the N light-emitting units may be controlled to work alternately to reduce the working hours of each light-emitting unit so as to lengthen the service life of the display panel under the condition of without affecting the light-emitting effect of the display panel.

The plurality of sub-pixels arranged in an array in the display panel may include sub-pixels of various colors and the sub-pixels of the same color may be plural. For example, there may be a plurality of red sub-pixels, green sub-pixels and blue sub-pixels in the display panel. In one optional implementation, the at least one target sub-pixel may be a sub-pixel of a first color. The service lives of the sub-pixels of different colors in the display panel vary. For example, blue sub-pixels are generally considered to have high loss and a short service life. Therefore, in the embodiments of the present disclosure, among the sub-pixels of various colors, the sub-pixels of the first color that have a shorter service life (for example, the blue sub-pixels) may be determined as the target sub-pixels, and the target sub-pixels are configured to adopt the pixel structure shown in FIG. 1. Thus, the difference in the service lives of the sub-pixels of various colors in the display panel may be reduced.

In another optional implementation, each sub-pixel in the display panel may be the target sub-pixel. That is, each sub-pixel in the display panel may adopt the pixel structure shown in FIG. 1, so as to effectively lengthen the service life of the display panel.

Figure 2:
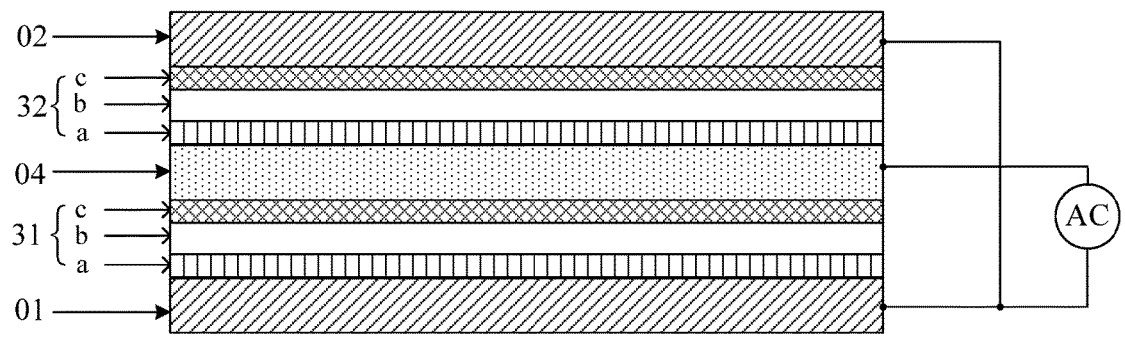
FIG. 2 is a structural schematic diagram of a target sub-pixel in another display panel provided in an embodiment of the present disclosure.

FIG. 2 illustrates a structural schematic diagram of a target sub-pixel in another display panel provided in an embodiment of the present disclosure. Referring to FIG. 2, a light-emitting unit 31 and a light-emitting unit 32 may be arranged in a laminated mode in each target sub-pixel, that is, N=2. The transparent electrode 04 arranged between the light-emitting unit 31 and the light-emitting unit 32 may be connected to an electrode of an AC driver AC, and the first electrode 01 and the second electrode 02 may be respectively connected to the other electrode of the AC driver AC.

The first light-emitting unit 31 of the two light-emitting units is configured to emit light under the drive of the transparent electrode 04 and the first electrode 01, and the second light-emitting unit 32 of the two light-emitting units is configured to emit light under the drive of the transparent electrode 04 and the second electrode 02.

Referring to FIG. 2, each light-emitting unit may include a hole transport layer a, a light-emitting layer b and an electron transport layer c sequentially arranged in a laminated mode. Besides, the electron transport layer c in the first light-emitting unit 31 and the hole transport layer a in the second light-emitting unit 32 are respectively at two sides of the transparent electrode 04. That is, various layers are arranged in the same sequence in the two light-emitting units.

Figure 3:
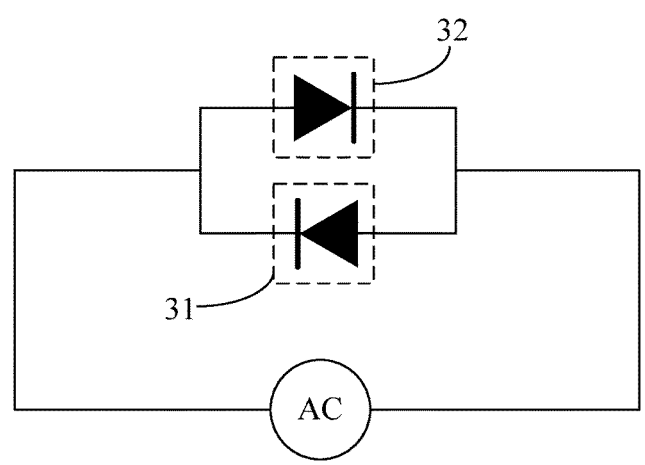
FIG. 3 is an equivalent circuit diagram of a connection between two light-emitting units in the target sub-pixel and an AC driver shown in FIG. 2.

FIG. 3 is an equivalent circuit diagram of a connection between the two light-emitting units in the target sub-pixel and the AC driver shown in FIG. 2. As shown in FIG. 3, the light-emitting unit 31 and the light-emitting unit 32 are connected in parallel between two electrodes of the AC driver. As further shown in FIG. 2 and FIG. 3, the connection direction between the light-emitting unit 31 and the AC driver AC is opposite to that between the light-emitting unit 32 and the AC driver AC. That is, the positive electrode of the light-emitting unit 31 and the negative electrode of the light-emitting unit 32 are connected to the same electrode of the AC driver AC, and the negative electrode of the light-emitting unit 31 and the positive electrode of the light-emitting unit 32 are connected to the same electrode of the AC driver AC. In this way, it may be guaranteed that during the alternating current driving process of the AC driver AC, only one light-emitting is active during each half alternating current cycle and the two light-emitting units may work alternately during each alternating current cycle.

For example, when the AC driver AC is in the positive half cycle (i.e., the half cycle during which the driving signal outputted by the AC driver AC is a forward direction), the voltage of the first electrode 01 is a positive voltage relative to the voltage of the transparent electrode 04. In this case, the hole transport layer a in the first light-emitting unit 31 transfers holes to the light-emitting layer b and the electron transport layer c in the first light-emitting unit 31 transfers electrons to the light-emitting layer b. The electrons and holes meet in the light-emitting layer b of the first light-emitting unit 31 and recombine to enable the light-emitting molecules to emit visible light. While, since the voltage of the second electrode 02 is a positive voltage relative to the voltage of the transparent electrode 04 at this moment, the second light-emitting unit 32 is in a reverse biased state and emits no light.

When the AC driver AC is in the negative half cycle (i.e., the half cycle during which the driving signal outputted by the AC driver AC is a reverse direction), the voltage of the transparent electrode 04 is a positive voltage relative to the voltage of the second electrode 02. In this case, the hole transport layer a and the electron transport layer c in the second light-emitting unit 32 respectively transfer holes and electrons to the light-emitting layer b, to drive the second light-emitting unit 32 to emit light. While, the first light-emitting unit 31 is in a reverse biased state at this moment.

With the continuous change in the direction of the driving signal outputted by the AC driver AC, the light-emitting unit 31 and the light-emitting unit 32 are enabled to work alternately within the positive and negative half cycles of the AC driver AC.

Further, the AC driver may control the inactive light-emitting unit to be in a reverse biased state, such that extra holes and electrons that do not recombine in the light-emitting unit will change their movement directions and move towards the reverse directions, to correspondingly consume the electrons and holes that do recombine and accumulate in the light-emitting layer. Thus, the stability of the threshold voltage of the light-emitting units in the display panel and the luminance stability of the display panel are improved, and the energy utilization efficiency is increased, thereby lengthening the service life of the display panel.

In the embodiments of the present disclosure, electrodes at two side of each light-emitting unit may be respectively connected to two electrodes of the AC driver when the number N of the light-emitting units in each target pixel-unit is greater than 2. Among the N light-emitting units, at least two light-emitting units are connected to the AC driver in opposite directions. Therefore, at least two light-emitting units emit light simultaneously during the positive half cycle or the negative half cycle of the AC driver.

Figure 4:
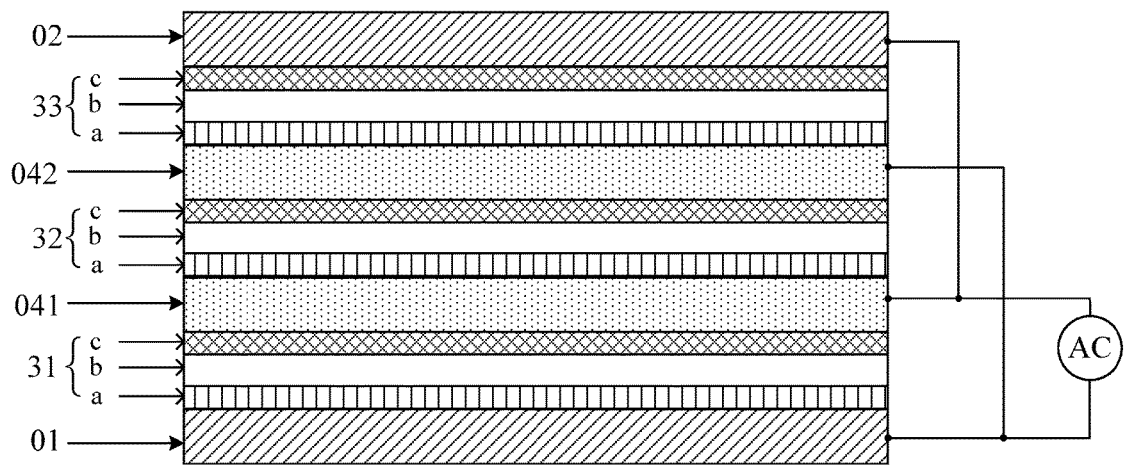
FIG. 4 is a structural schematic diagram of a target sub-pixel in yet another display panel provided in an embodiment of the present disclosure.

Exemplarily, FIG. 4 illustrates a structural schematic diagram of yet another target pixel-unit provided in an embodiment of the present disclosure. As shown in FIG. 4, the target pixel-unit may be provided with three light-emitting units 31, 32 and 33 in a laminated mode, i.e., N=3. A transparent electrode 041 arranged between the light-emitting unit 31 and the light-emitting unit 32, and the second electrode 02 may be connected to an electrode of the AC driver AC. A transparent electrode 042 arranged between the light-emitting unit 32 and the light-emitting unit 33, and the first electrode 01 may be connected to the other electrode of the AC driver AC.

Figure 5:
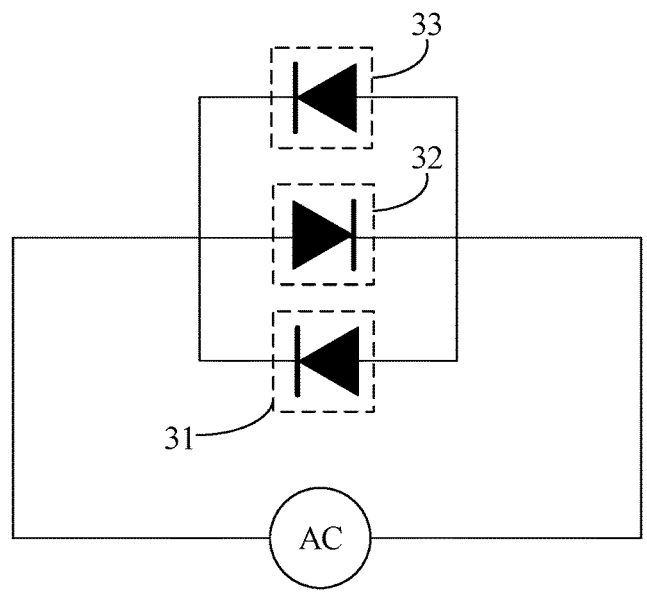
FIG. 5 is an equivalent circuit diagram of a connection between three light-emitting units in the target sub-pixel and an AC driver shown in FIG. 4.

The first light-emitting unit 31 may emit light under the drive of the transparent electrode 041 and the first electrode 01. The second light-emitting unit 32 may emit light under the drive of the transparent electrode 041 and the transparent electrode 042. The third light-emitting unit 33 may emit light under the drive of the transparent electrode 042 and the second electrode 02. FIG. 5 is an equivalent circuit diagram of a connection between the three light-emitting units in the target sub-pixel and the AC driver shown in FIG. 4. As shown in FIG. 5, among the three light-emitting units, the light-emitting unit 31 and the light-emitting unit 33 are connected to the AC driver AC in the totally same direction. Therefore, during a half alternating current cycle of the AC driver AC, the light-emitting unit 31 and the light-emitting unit 33 may emit light simultaneously, while the light-emitting unit 32 emits no light. During the other half alternating current cycle of the AC driver AC, only the light-emitting unit 32 emits light, while the light-emitting unit 31 and the light-emitting unit 33 emit no light.

Figure 6:
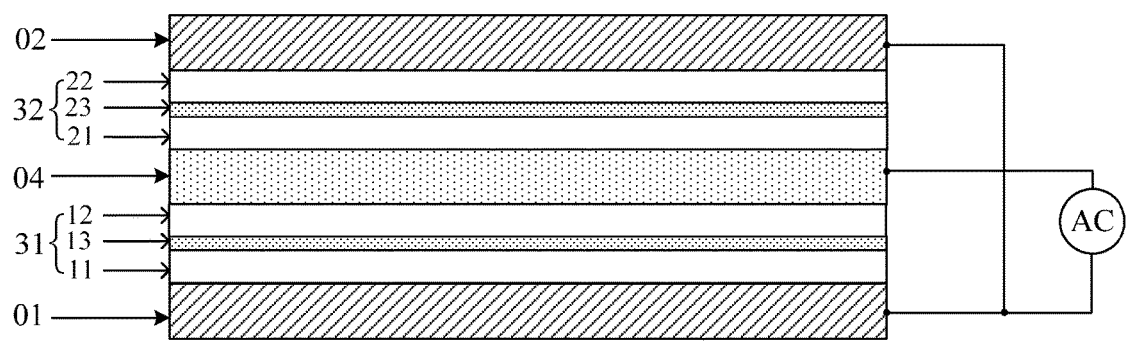
FIG. 6 is a structural schematic diagram of a target sub-pixel in yet another display panel provided in an embodiment of the present disclosure.

FIG. 6 is a structural schematic diagram of yet another target sub-pixel provided by in an embodiment of the present disclosure. Referring to FIG. 6, each light-emitting unit may include: a plurality of light-emitting sub-units arranged in series. For example, in FIG. 6, the light-emitting unit 31 includes a light-emitting sub-unit 11 and a light-emitting sub-unit 12, and a connection layer 13 is arranged between the two light-emitting sub-units. The light-emitting unit 32 also includes a light-emitting sub-unit 21 and a light-emitting sub-unit 22, and a connection layer 23 is also arranged between the two light-emitting sub-units.

The connection layer between two adjacent light-emitting sub-units may be a transparent connection layer and may include an organic material layer and an electron receiving layer. Each light-emitting sub-unit may include a hole transport layer, a light-emitting layer and an electron transport layer sequentially arranged in a laminated mode, and the electron transport layer in the first light-emitting unit 31 and the hole transport layer in the second light-emitting unit 32 are respectively at two sides of the transparent electrode 04.

For example, the electron transport layer in the light-emitting sub-unit 12 and the hole transport layer in the light-emitting sub-unit 21 are respectively at two sides of the transparent electrode 04.

Figure 7:
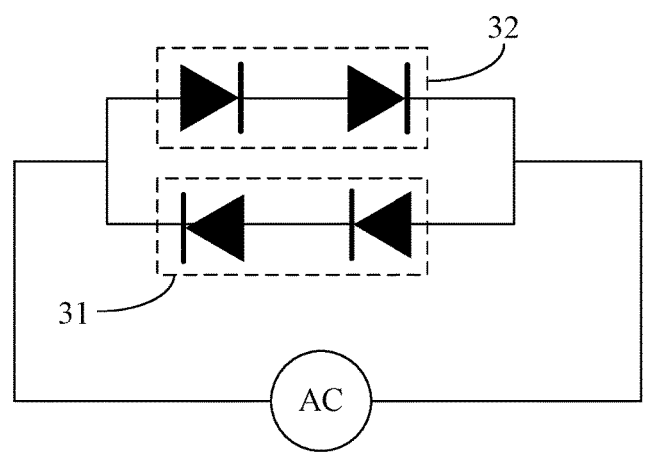
FIG. 7 is an equivalent circuit diagram of a connection between two light-emitting units in the target sub-pixel and an AC driver shown in FIG. 6.

FIG. 7 is an equivalent circuit diagram of a connection between two light-emitting units in the target sub-pixel and the AC driver shown in FIG. 6. It can be seen from FIG. 6 and FIG. 7, the light-emitting unit 31 and the light-emitting unit 32 are connected to the AC driver AC in opposite directions, while the light-emitting sub-units in each light-emitting unit are connected to the AC driver AC in the same direction. Therefore, during the alternating current driving process, only one light-emitting unit is active during each half alternating current cycle and the plurality of light-emitting sub-units in the light-emitting unit may are active simultaneously, such that the display brightness of the display panel may be improved effectively.

In the embodiments of the present disclosure, when only a portion of the plurality of sub-pixels in the display panel are the target sub-pixels, each sub-pixel in the display panel, except the target sub-pixels, may adopt the traditional pixel structure. For example, each sub-pixel may include: a first electrode, a second electrode and a light-emitting unit arranged between the first electrode and the second electrode.

In order to guarantee that other sub-pixels, except the target sub-pixels, work normally during the negative half cycle of the AC driver, other sub-pixels need to be driven in a DC drive manner. That is, the first electrode and the second electrode in each sub-pixel, except the target sub-pixels, are respectively connected to two electrodes of a DC driver.

Exemplarily, the red sub-pixels and the green sub-pixels in the display panel may adopt the traditional sub-pixel structure and may be driven by a DC driver.

In summary, the embodiments of the present disclosure provide a display panel. There is at least one target sub-pixel in the display panel. A plurality of light-emitting units are arranged in a laminated mode between two electrodes of each target sub-pixel, and a transparent electrode is arranged between any two adjacent light-emitting units. Therefore, each light-emitting unit may be driven respectively through two electrodes at two sides of each light-emitting unit, and the plurality of light-emitting units may be controlled to work alternately to reduce the working hours of each light-emitting unit so as to lengthen the service life of the display panel. Additionally, when the AC driver is adopted to drive the display panel, only one light-emitting unit is driven to emit light during each alternating current cycle, and therefore the driving voltage of the display panel may not be increased.

The embodiments of the present disclosure further provide a method for driving a display panel. The display panel may include the target sub-pixel shown in FIG. 1, FIG. 2, FIG. 4 or FIG. 6. Specifically, the driving method may include: N driving stages and N is an integer greater than 1. That is, the number of the driving stages included in the driving method is the same as that of the light-emitting units in the target sub-pixel.

During the $i^{th}$ driving stage of the N driving stages, voltages may be applied to electrodes at two sides of the $i^{th}$ light-emitting unit in each target sub-pixel to drive the $i^{th}$ light-emitting unit to emit light. N is a positive integer less than or equal to than N.

Referring to FIG. 2, each target sub-pixel may include two light-emitting units arranged in a laminated mode, that is N=2. The transparent electrode arranged between the two light-emitting units is connected to an electrode of the AC driver, and the first electrode and the second electrode are respectively connected to the other electrode of the AC driver. Referring to FIG. 8, the driving method provided in the embodiments of the present disclosure may include:

Step 101, a first driving stage: a driving signal in a first direction is provided via the AC driver such that the voltage of the first electrode is a positive voltage relative to the voltage of the transparent electrode, so as to drive the first light-emitting unit to emit light.

Step 102, a second driving stage: a driving signal in a second direction is provided via the AC driver such that the voltage of the transparent electrode is a positive voltage relative to the voltage of the second electrode, so as to drive the second light-emitting unit to emit light.

FIG. 9 is a sequence diagram of a driving signal outputted by an AC driver provided in an embodiment of the present disclosure. As shown in FIG. 9, during the first driving stage T1, the AC driver AC provides a driving signal in the first direction (i.e., the forward direction). In this case, the first light-emitting unit in the target sub-pixel is turned on and emits light, and the second light-emitting unit is turned off and emits no light.

During the second driving stage T2, the AC driver AC provides a driving signal in the second direction (i.e., the reverse direction). In this case, the second light-emitting unit in the target sub-pixel is turned on and emits light, and the first light-emitting unit is turned off and emits no light.

Further, as shown in FIG. 9, the AC driver may perform the first driving stage T1 and the second driving stage T2 alternately, to drive the two light-emitting units in each target sub-pixel in the display panel to work alternately.

Here, the duration of the first driving stage T1 may be equal to that of the second driving stage T2, and the total duration of the first driving stage T1 and the second driving stage T2 equals to the alternating current cycle of the AC driver. Exemplarily, the duration of each driving stage may be 10 ms. Correspondingly, the alternating current cycle of the AC driver may be 20 ms.

It should be noted that, when only a portion of the plurality of sub-pixels in the display panel are the target sub-pixels, each of the plurality of sub-pixels, except the target sub-pixels, may include: a first electrode, a second electrode and a light-emitting unit arranged between the first electrode and the second electrode. The first electrode and the second electrode may be respectively connected to two electrodes of the DC driver. Correspondingly, during each driving stage of the N driving stages, the DC driver may continuously drive the each sub-pixel, except the target sub-pixels.

In summary, there is provided a method for driving a display panel in the present disclosure. The driving method may include a plurality of driving stages. During each driving state, one light-emitting unit in the target sub-pixel may be driven to work. Therefore, the working hours of each light-emitting unit in the target sub-pixel is reduced, thereby lengthening the service life of the display panel.

The embodiments of the present disclosure further provide a display device. The display device may include a display panel, which may include the target sub-pixel shown in FIG. 1, FIG. 2, FIG. 4 or FIG. 6. The display device may be an OLED panel, an AMOLED panel, a mobile phone, a tablet computer, a TV, a display, a laptop, a digital photo frame, a navigator, or any product or part with display function.

In some embodiments, each target sub-pixel in the display panel includes two light-emitting unis arranged in a laminated mode and the display device may further include an AC driver.

An electrode of the AC driver is connected to the transparent electrode of each target sub-pixel in the display panel, and the other electrode thereof is connected to the first electrode and the second electrode in the each target sub-pixel respectively. The AC driver may be adopted to realize the alternating current drive to the display panel.

In some embodiments, when only a portion of the plurality of sub-pixels in the display panel are the target sub-pixels, each of the plurality of sub-pixels, except the target sub-pixels, may include: a first electrode, a second electrode and a light-emitting unit arranged between the first electrode and the second electrode. Correspondingly, the display device may further include: a DC driver.

Two electrodes of the DC driver may be respectively connected to the first electrode and the second electrode of each sub-pixel, except the target sub-pixels.

In some embodiments, the light rays emitted from the N light-emitting units in each target sub-pixel may be of the same color.

In summary, there is provided a display device in the present disclosure. There is at least one target sub-pixel in the display panel included in the display device. A plurality of light-emitting units are arranged in a laminated mode between two electrodes of each target sub-pixel, and a transparent electrode is arranged between any two adjacent light-emitting units. Therefore, each light-emitting may be driven respectively through two electrodes at two sides of each light-emitting unit and the plurality of light-emitting units may be controlled to work alternately, so as to reduce the working hours of each light-emitting unit, thereby lengthening the service life of the display device.

Understandably, the term "and/or" in the present disclosure merely describes the correspondence of the corresponding objects, indicating three kinds of relationship. For example, A and/or B, can be expressed as: A exists alone, A and B exist concurrently, B exists alone.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A display panel, comprising:
   a plurality of sub-pixels arranged in an array, wherein the plurality of sub-pixels arranged in an array include at least one target sub-pixel, and each target sub-pixel includes: a first electrode, a second electrode and two light-emitting units arranged in a laminated mode between the first electrode and the second electrode;
   a transparent electrode is arranged between the two adjacent light-emitting units, and each light-emitting unit is configured to emit light under the drive of two electrodes adjacent thereto;
   the transparent electrode is connected to an electrode of an AC driver, and the first electrode and the second electrode are respectively connected to an other electrode of the AC driver;

wherein the AC driver is configured to:
provide a driving signal in a first direction, during a first driving stage of driving the display panel to emit light via the AC driver, such that the voltage of the first electrode is a positive voltage relative to the voltage of the transparent electrode, so as to drive the first light-emitting unit to emit light; and
provide a driving signal in a second direction, during a second driving stage of driving the display panel to emit light via the AC driver, such that the voltage of the transparent electrode is a positive voltage relative to the voltage of the second electrode, so as to drive the second light-emitting unit to emit light.

2. The display panel of claim 1, wherein
a first light-emitting unit of the two light-emitting units is configured to emit light under the drive of the transparent electrode and the first electrode, and a second light-emitting unit of the two light-emitting units is configured to emit light under the drive of the transparent electrode and the second electrode.

3. The display panel of claim 2, wherein
each of the light-emitting units includes a hole transport layer, a light-emitting layer and an electron transport layer sequentially arranged in a laminated mode; and
the electron transport layer in the first light-emitting unit and the hole transport layer in the second light-emitting unit are respectively at two sides of the transparent electrode.

4. The display panel of claim 2, wherein
each of the light-emitting units includes: a plurality of light-emitting sub-units arranged in series, and each of the light-emitting sub-units includes a hole transport layer, a light-emitting layer and an electron transport layer sequentially arranged in a laminated mode; and
the electron transport layer in the first light-emitting unit and the hole transport layer in the second light-emitting unit are respectively at two sides of the transparent electrode.

5. The display panel of claim 2, wherein
the each sub-pixel in the display panel, except the target sub-pixel, includes: a first electrode, a second electrode and a light-emitting unit arranged between the first electrode and the second electrode.

6. The display panel of claim 5, wherein
the first electrode and the second electrode in the each sub-pixel in the display panel, except the target sub-pixel, are respectively connected to two electrodes of a DC driver.

7. The display panel of claim 1, wherein
the each sub-pixel in the display panel is the target sub-pixel.

8. The display panel of claim 1, wherein
light rays emitted from the two light-emitting units in the each target sub-pixel are of the same color.

9. The display panel of claim 8, wherein
the plurality of sub-pixels arranged in an array include sub-pixels of various colors, and the at least one target sub-pixel is a sub-pixel of a first color.

10. The display panel of claim 9, wherein
the plurality of sub-pixels arranged in an array include red sub-pixels, green sub-pixels and blue sub-pixels, and the at least one target sub-pixel is the blue sub-pixel.

11. The display panel of claim 10, wherein
the transparent electrode is manufactured from a metal material and/or a metal oxide material.

12. The display panel of claim 11, wherein
the metal material includes at least one of the materials selected from the group of: lithium, magnesium, silver, gold, aluminum, aluminum lithium alloy, calcium, magnesium indium alloy and magnesium silver alloy; and
the metal oxide material includes at least one of the materials selected from the group of: indium tin oxide, indium zinc oxide, zinc oxide, aluminum-doped zinc oxide, indium oxide and tin oxide.

13. The display panel of claim 1, wherein
a thickness range of the transparent electrode is 10 nm-20 nm.

14. A method for driving a display panel, wherein the display panel includes: a plurality of sub-pixels arranged in an array, the plurality of sub-pixels arranged in an array include at least one target sub-pixel, and each target sub-pixel includes: a first electrode, a second electrode and two light-emitting units arranged in a laminated mode between the first electrode and the second electrode; a transparent electrode is arranged between the two adjacent light-emitting units, each light-emitting unit is configured to emit light under the drive of two electrodes adjacent thereto, the transparent electrode is connected to an electrode of an AC driver, and the first electrode and the second electrode are respectively connected to an other electrode of the AC driver; the method comprises: N driving stages, wherein N is an integer greater than 1;
during an $i^{th}$ driving stage of the N driving stages, applying voltages to electrodes at two sides of an $i^{th}$ light-emitting unit in each target sub-pixel to drive the $i^{th}$ light-emitting unit to emit light, wherein i is a positive integer less than or equal to N;
wherein N is equal to 2;
wherein during a first driving stage of the N driving stages, applying voltages to electrodes at two sides of a first light-emitting unit in the each target sub-pixel to drive the first light-emitting unit to emit light includes: providing a driving signal in a first direction via the AC driver such that the voltage of the first electrode is a positive voltage relative to the voltage of the transparent electrode, so as to drive the first light-emitting unit to emit light; and
wherein during a second driving stage of the N driving stages, applying voltages to electrodes at two sides of a second light-emitting unit in the each target sub-pixel to drive the second light-emitting unit to emit light includes: providing a driving signal in a second direction via the AC driver such that the voltage of the transparent electrode is a positive voltage relative to the voltage of the second electrode, so as to drive the second light-emitting unit to emit light.

15. A display device, comprising a display panel, wherein the display panel includes: a plurality of sub-pixels arranged in an array, the plurality of sub-pixels arranged in an array include at least one target sub-pixel, and each target sub-pixel includes: a first electrode, a second electrode and two light-emitting units arranged in a laminated mode between the first electrode and the second electrode; and a transparent electrode is arranged between the two adjacent light-emitting units, and each light-emitting unit is configured to emit light under the drive of two electrodes adjacent thereto;
wherein the each target sub-pixel in the display panel includes two light-emitting units arranged in a laminated mode, and the display device further includes: an AC driver, wherein an electrode of the AC driver is connected to the transparent electrode of the each target sub-pixel in the display panel and an other electrode thereof is connected to the first electrode and the second electrode in the each target sub-pixel respectively;

wherein the AC driver is configured to:

provide a driving signal in a first direction, during a first driving stage of driving the display panel to emit light via the AC driver, such that the voltage of the first electrode is a positive voltage relative to the voltage of the transparent electrode, so as to drive the first light-emitting unit to emit light; and provide a driving signal in a second direction, during a second driving stage of driving the display panel to emit light via the AC driver, such that the voltage of the transparent electrode is a positive voltage relative to the voltage of the second electrode, so as to drive the second light-emitting unit to emit light.

16. The display device of claim 15, wherein the each sub-pixel in the display panel, except the target sub-pixel, includes: a first electrode, a second electrode and a light-emitting unit arranged between the first electrode and the second electrode; and the display device further includes:

a DC driver, wherein two electrodes of the DC driver are respectively connected to the first electrode and the second electrode in the each sub-pixel, except the target sub-pixel.

17. The display device of claim 15, wherein light rays emitted from the two light-emitting units in the each target sub-pixel are of the same color.

* * * * *